(12) United States Patent
Horiuchi et al.

(10) Patent No.: US 6,700,137 B2
(45) Date of Patent: Mar. 2, 2004

(54) LIGHT EMITTING DIODE DEVICE

(75) Inventors: Megumi Horiuchi, Yamanashi-ken (JP);
Shinobu Nakamura, Yamanashi-ken (JP)

(73) Assignee: Citizen Electronic Co., Ltd., Yamanashi-ken (JP)

( * ) Notice: Subject to any disclaimer, the term of this patent is extended or adjusted under 35 U.S.C. 154(b) by 0 days.

(21) Appl. No.: 10/199,298

(22) Filed: Jul. 22, 2002

(65) Prior Publication Data
US 2003/0020077 A1 Jan. 30, 2003

(30) Foreign Application Priority Data
Jul. 25, 2001 (JP) ........................................ 2001-225211

(51) Int. Cl.[7] ...................... H01L 27/15; H01L 31/0232
(52) U.S. Cl. ........................................... 257/81; 257/432
(58) Field of Search ........................... 257/81, 80, 82, 257/88, 91, 99, 100, 432

(56) References Cited
U.S. PATENT DOCUMENTS
6,459,130 B1 * 10/2002 Arndt et al. ................. 257/432
* cited by examiner

*Primary Examiner*—Wael Fahmy
*Assistant Examiner*—Hoa B. Trinh
(74) *Attorney, Agent, or Firm*—Dennison, Schultz, Dougherty & MacDonald

(57) ABSTRACT

A light emitting diode device has a reflector member having an approximately semispherical recess. A reflector surface is provided on an inner surface of the recess and a light emitting diode is provided in the recess. The light emitting diode is located at a position so that a part of light beams emitted from the light emitting diode recedes from an optical axis, and another part of the light beams approaches to the optical axis.

4 Claims, 13 Drawing Sheets

LIGHT EMITTING DIODE DEVICE

BACKGROUND OF THE INVENTION

The present invention relates to a light emitting diode device having a light emitting diode and provided for an electronic equipment, and more particularly to a light emitting diode device having a reflector.

FIG. 26 is a perspective view showing a conventional light emitting diode device, and FIG. 27 is a sectional view of the light emitting diode device.

The light emitting diode device comprises a substrate 101 made of an epoxy resin, a cathode electrode pattern 102 and an anode electrode pattern 103 formed on the upper surface of the substrate 101. These patterns 102 and 103 are connected to underside patterns 102a and 103a through leads 104 provided in through-holes.

A light emitting diode 105 is securely mounted on the cathode electrode pattern 102. The light emitting diode 105 is connected to the anode electrode pattern 103 by a bonding wire 109. A cylindrical reflector 106 is mounted on the substrate 101 surrounding the light emitting diode 105. An inner reflecting wall 107 has an inverted truncated cone shape, so that the light 108 emitted from the light emitting diode 105 in horizontal directions is reflected in vertical directions.

The light emitting diode (LED) 105, reflector 106, and bonding wire 109 are sealed by a sealing member 110 made of a transmissive resin.

The sealing member 110 has a semispherical lens 110b. The semispherical lens 110b is provided for condensing the light 108 into light 108b.

FIG. 28 is a perspective view showing another reflector, and FIG. 29 is a sectional view of the reflector.

The reflector 116 has a semispherical reflecting wall 117 so as to parallely reflect the light emitted from the LED 105 in vertical direction.

Although the light emitting diode device illuminates a small area, the device can not light a large area. Therefore, the device can not be used as an edge light for irradiating a panel.

SUMMARY OF THE INVENTION

An object of the present invention is to provide a light emitting diode device which may irradiate a wide area.

According to the present invention, there is provided a light emitting diode device comprising a reflector member having an approximately semispherical recess, a reflector surface provided on an inner surface of the recess, a light emitting diode provided in the recess, and the light emitting diode being located at a position so that a part of light beams emitted from the light emitting diode recedes from an optical axis, and another part of the light beams approaches to the optical axis.

In an aspect of the present invention, the device comprises a substrate, and the reflector member being mounted on the substrate.

The reflector surface includes a first reflector surface about an X-axis and a second reflector surface about a Y-axis.

In another aspect, the first reflector surface and the second reflector surface are different in curvature.

The first and second reflector surfaces comprise same parabolas, both parabolas are disposed so as to be different in position of focus.

The reflector surface has a rectangular shape in plan view, and the reflector member comprises four reflector surfaces divided by a pair of diagonal lines.

These and other objects and features of the present invention will become more apparent from the following detailed description with reference to the accompanying drawings.

DETAILED DESCRIPTION OF THE PREFERRED EMBODIMENT

The principle of the present invention will be described hereinafter.

Figure 1:
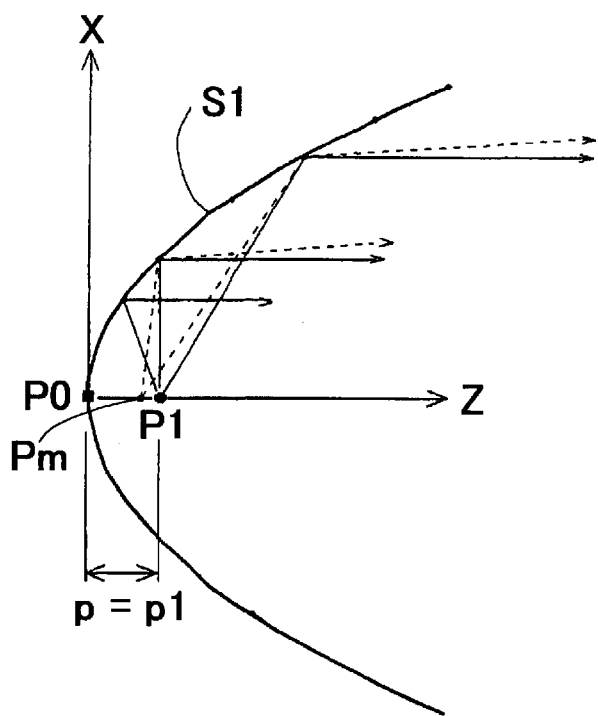
FIG. 1 is a graph showing a parabola in an XZ-plane of an XYZ orthogonal coordinate system.
Figure 2:
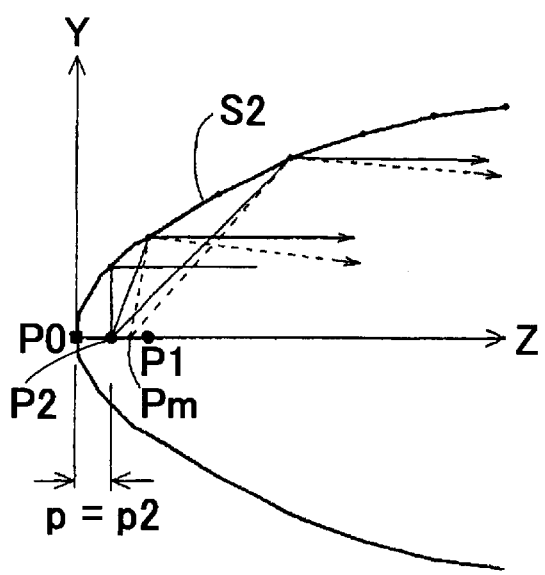
FIG. 2 is a graph showing a parabola in a YZ-plane of the orthogonal coordinate system.

FIG. 1 is a graph showing a parabola in an XZ-plane of an XYZ orthogonal coordinate system, and FIG. 2 is a graph showing a parabola in a YZ-plane of the orthogonal coordinate system.

Referring to FIG. 1, the parabola S1 is expressed by the following equation of parabola $$X^2=4pZ=4p1Z$$

where p1 is the focal distance from the origin PO to the focus P1.

Here, if the parabola S1 is a parabolic mirror, light beams emitted from a light source located at the focus P1 are changed by the parabolic mirror to light beams parallel with the Z-axis (optical axis) as shown by solid lines. However, if the light source is located at a point Pm deflected from the focus P1 to the origin PO, the light beams from the light source are changed to light beams receding from the Z-axis as shown by dotted lines, thereby expanding the bundle of rays in the XZ-plane.

Referring to FIG. 2, the parabola S2 is expressed by the following equation of parabola, $$Y^2=4pZ=4p2Z$$

where p2 is the focal distance from the origin PO to the focus P2.

In the parabola $Y^2$, the focal distance p2 is smaller than the focal distance p1 (p2<p1). Therefore, the curvature of the reflector (inverse number of radius of curvature) of the parabola S2 is larger than that of the parabola S1.

When the light beams emitted from the focus P2 strike the parabola S2, the light beams are changed to light beams parallel with the Z-axis as shown by solid lines. However, if the light source is located at a point Pm distant from the origin PO, the light beams from the light source are changed to light beams approaching the Z-axis as shown by dotted lines, thereby reducing the bundle of rays in the YZ-plane.

Consequently, if a reflector having the parabola S1 in the XZ-plane and the parabola S2 in the YZ-plane is prepared, and a light source is located at the point Pm between the focus P1 of the parabola S1 and the focus P2 of the parabola S2, the bundle of rays reflected from the reflector is wide in the XZ-plane and narrow in the YZ-plane.

The present invention is based on the above described principle.

Figure 3:
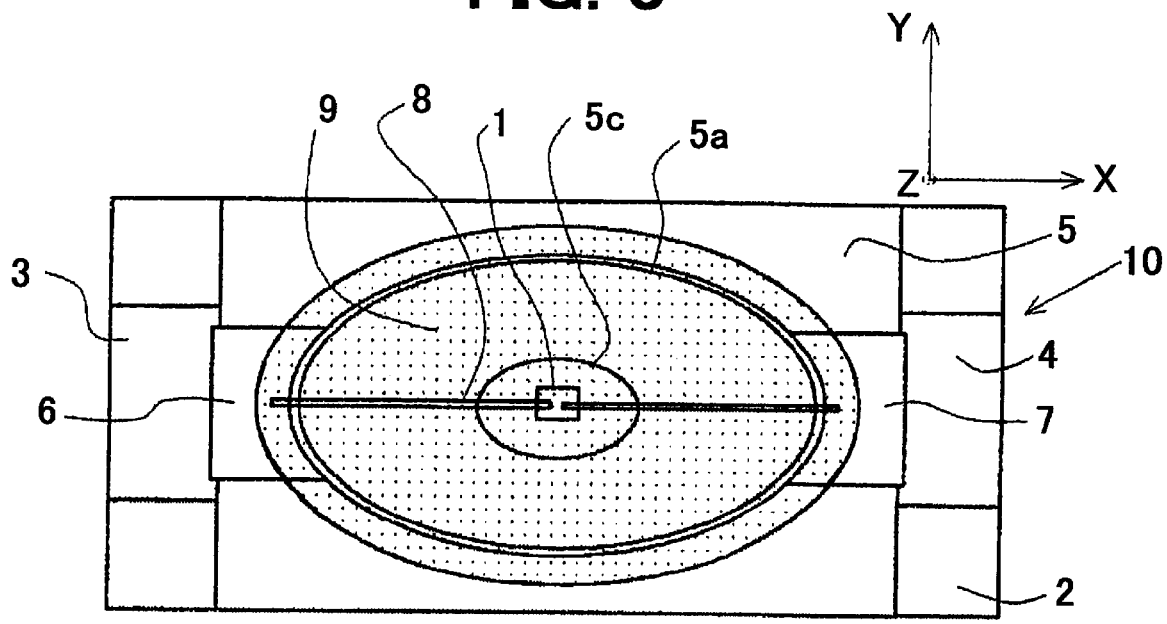
FIG. 3 is a plan view of a light emitting diode device according to a first embodiment of the present invention as viewed from a Z direction.
Figure 4:
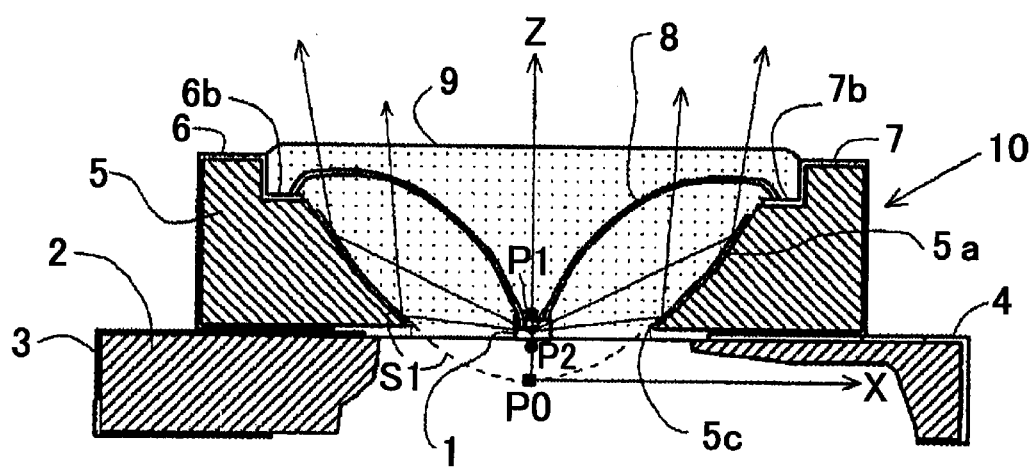
FIG. 4 is a sectional view of the device taken along an X-line.
Figure 5:
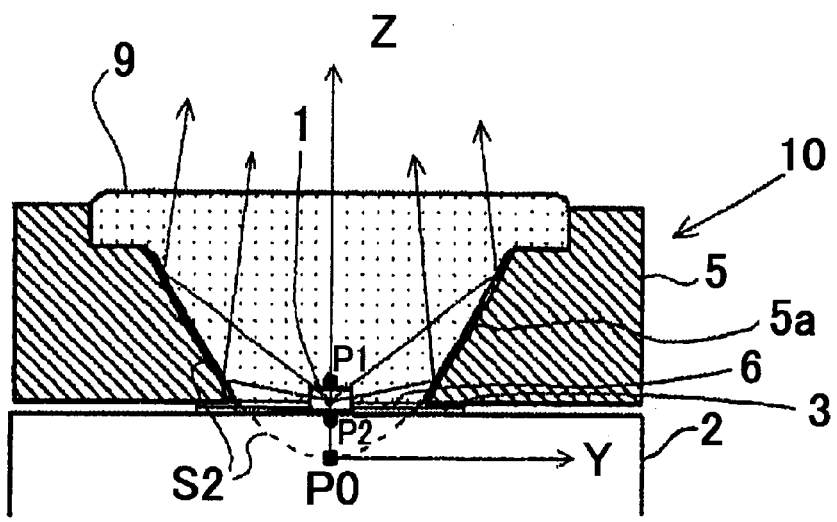
FIG. 5 is a sectional view taken along a Y-line.

FIG. 3 is a plan view of a light emitting diode device according to a first embodiment of the present invention as viewed from the Z direction, FIG. 4 is a sectional view of the device taken along the X-line, FIG. 5 is a sectional view taken along the Y-line.

The light emitting diode device 10 comprises a substrate 2 made of an epoxy resin, a cathode electrode pattern 3 and an anode electrode pattern 4 formed on the upper surface of the substrate 2. These patterns 3 and 4 are connected to underside patterns through leads provided on side walls of the substrate 2.

A light emitting diode 1 is securely mounted on the substrate 2. A reflector member 5 made of resin has an approximately semispherical recess and is mounted on the substrate 2 surrounding the light emitting diode 1. The reflector member 5 has a reflector surface 5a formed on the inner surface of the semispherical recess. The reflecting surface 5a comprises a parabola S1 having a focus at a point P1, and a parabola S2 having a focus at a point P2. The light emitting diode 1 is located at a point between the points P1 and P2. The parabolas S1 and S2 are cut at the upper surface of the substrate 2 to form an opening 5c as shown in FIG. 5.

The reflector surface 5a is coated with a shine Ag plating. A cathode lead pattern 6 and an anode lead pattern 7 are formed on outside walls and underside of the reflector member 5. The cathode and anode of the light emitting diode 1 are connected to a terminal 6b of the cathode lead pattern 6 and to a terminal 7b of the anode lead pattern 7 by bonding wires 8. The cathode lead pattern 6 and anode lead pattern 7 are connected to the cathode and anode electrode patterns 3, 4 at the undersides thereof.

The bonding wires 8 and the light emitting diode 1 are sealed by a sealing member 9 made of a transmissive resin charged in the recess of the reflector member 5.

Figure 6:
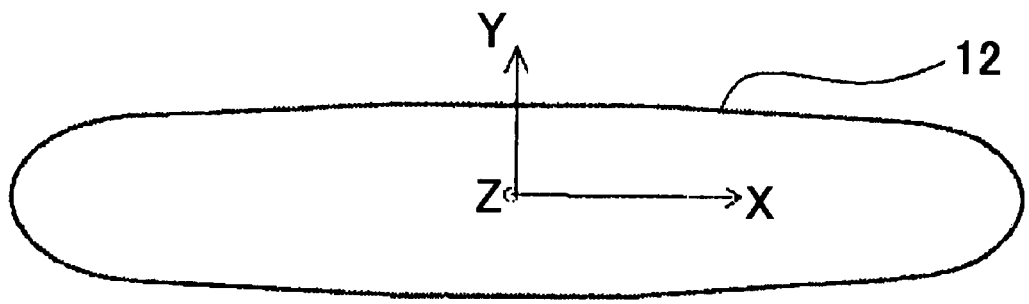
FIG. 6 is a sectional view of a bundle of rays.

When an electric current is applied to the light emitting diode 1 through electrode patterns 3, 4, lead patterns 6, 7 and bonding wires 8, the light emitting diode 1 emits light. Light beams reflected by the reflector surface 5a having the parabola S1 are expanded as shown in FIG. 4, and light beams reflected by the reflector surface 5a having the parabola S2 are reduced as shown in FIG. 5. Thus, as shown in FIG. 6, the section 12 of the bundle of rays has an elongated ellipse.

Figure 7:
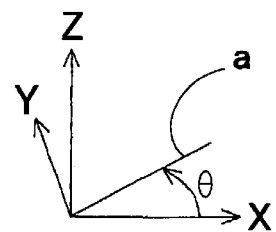
FIG. 7 shows an XYZ orthogonal coordinate system.

Referring to FIG. 7, a line a is a cutting line for cutting the reflector member 5. The cutting line a is rotated 180 degrees about the Z-axis in FIG. 3 in order to obtain a parabola in each section.

Figure 8:
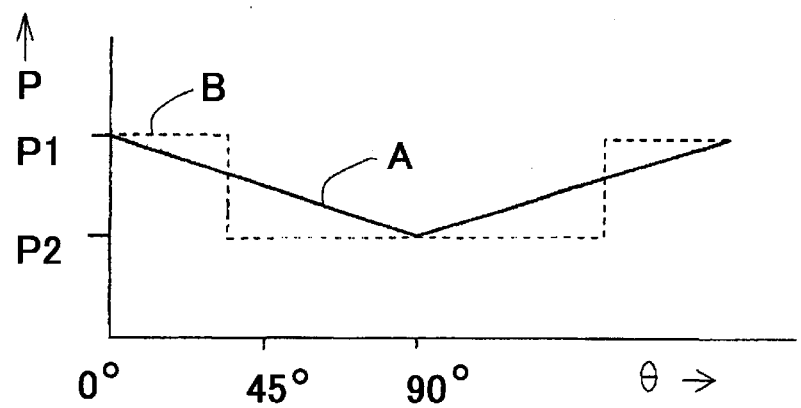
FIGS. 8 and 9 are graphs showing the positions of the focus P.

FIG. 8 is a graph showing the positions of the focus P. The line A shows the change of the focus. For example, when θ=45°, the focus P is at an intermediate position between the focus P1 and P2.

Figure 10:
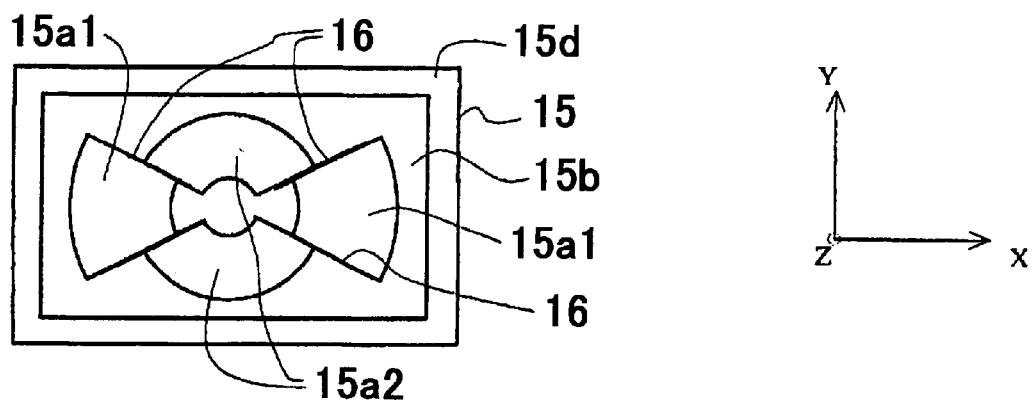
FIG. 10 is a plan view showing a reflector member in the second embodiment of the present invention.
Figure 11:
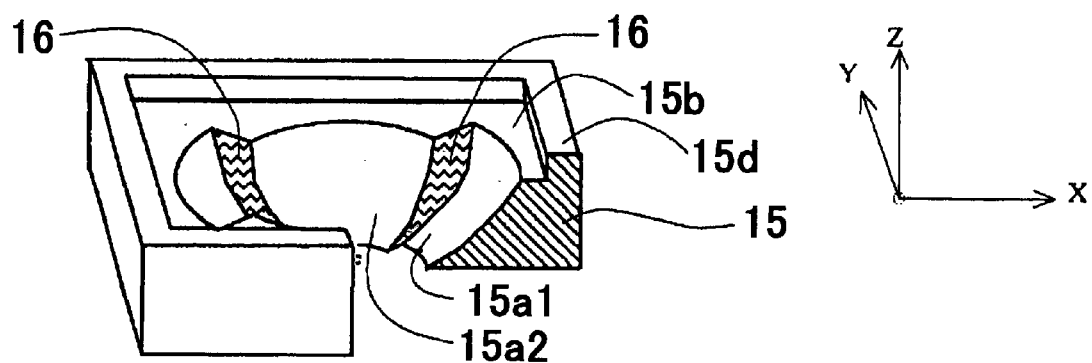
FIG. 11 is a perspective view of the reflector member.

FIG. 10 is a plan view showing a reflector member in the second embodiment of the present invention, and FIG. 11 is a perspective view of the reflector member.

The reflector member 15 comprises a first parabola area 15a1 having the parabola S1 and a second parabola area 15a2 having the parabola S2. In particular, the whole area of the first parabola area 15a1 is formed by the parabola S1, and the whole area of the second parabola area 15a2 is formed by the parabola S2.

The first parabola area 15a1 is disposed about the X-axis and the second parabola area 15a2 is disposed about the Y-axis.

The second parabola area 15a2 is located at a position near the Z-axis. Therefore, there is formed steps 16 between both areas.

Figure 12:
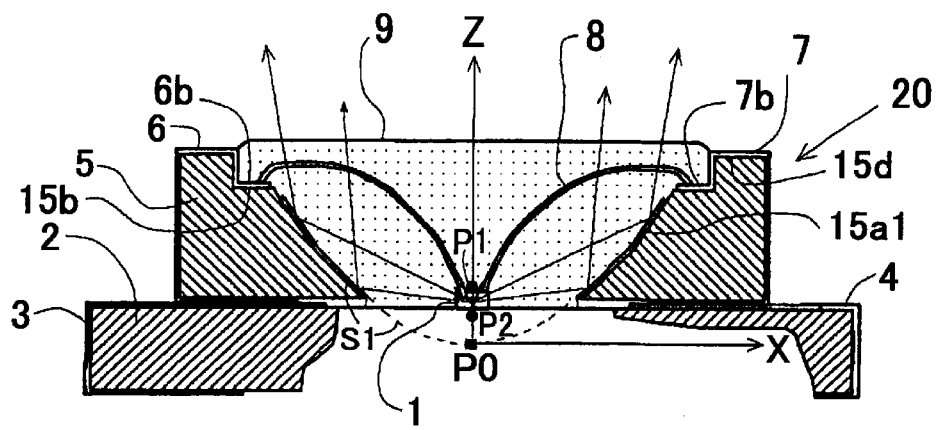
FIG. 12 is a sectional view taken along the X-line of a light emitting diode device based on the reflector member of FIG. 10.
Figure 13:
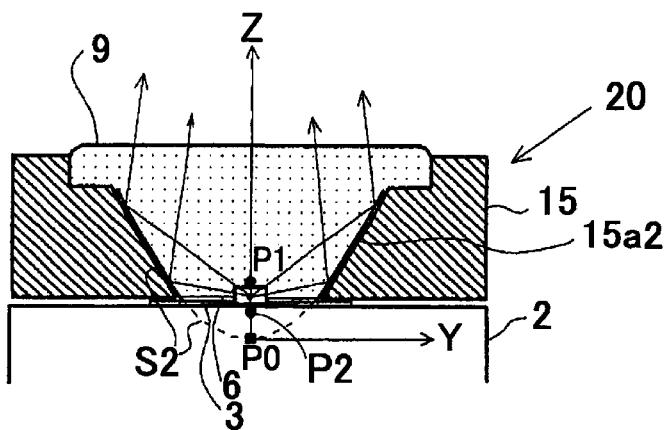
FIG. 13 is a sectional view of the device taken along the Y-line.

FIG. 12 is a sectional view taken along the X-line of a light emitting diode device based on the reflector member of FIG. 10, FIG. 13 is a sectional view of the device taken along the Y-line. The same parts as the device of FIGS. 4 and 5 are identified by the same reference numerals as FIGS. 4 and 5.

Positions of focuses P1 and P2 do not change as shown by a line B of FIG. 8.

Figure 14:
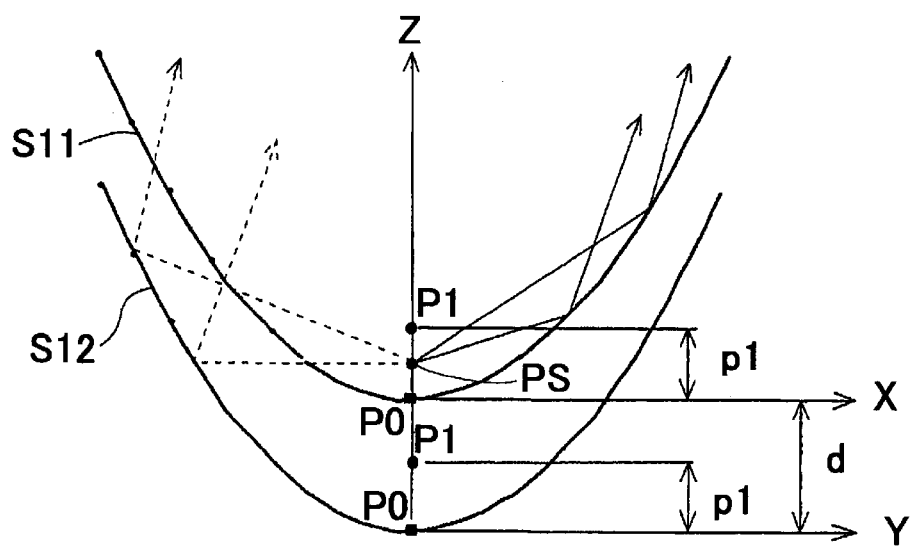
FIG. 14 is a graph showing a principle of the third embodiment of the present invention.
Figure 15:
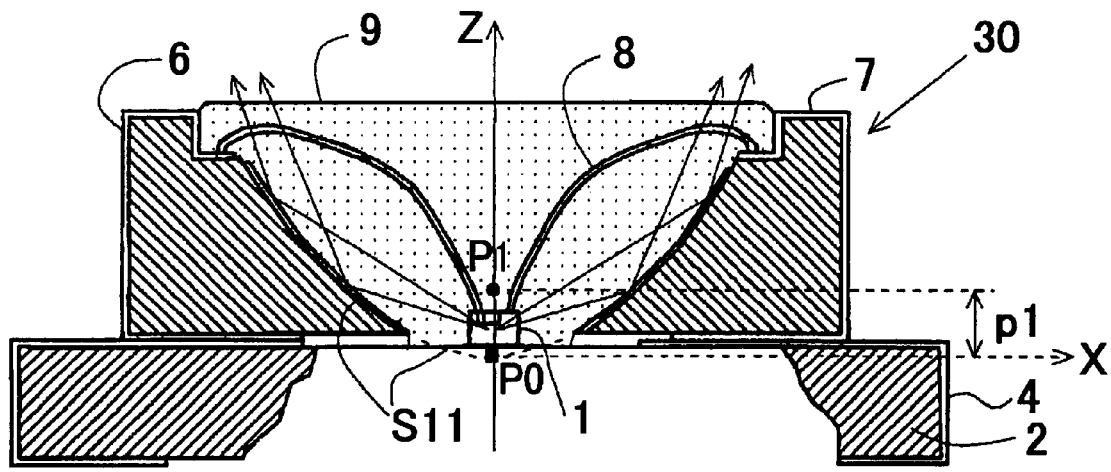
FIGS. 15 and 16 are sectional views of a light emitting diode device of the third embodiment.
Figure 16:
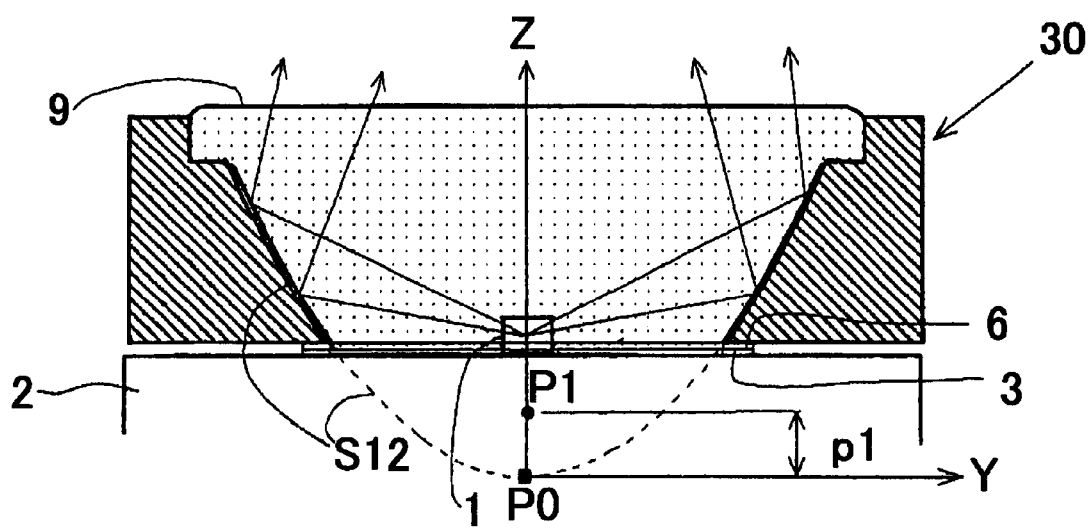

FIG. 14 is a graph showing a principle of the third embodiment of the present invention. FIGS. 15 and 16 are sectional views of a light emitting diode device of the third embodiment.

The light emitting diode device 30 has two parabolas S11 and S12 each of which has the same focal distance p1 as shown in FIG. 14. However, the parabola S12 is shifted from the X-axis distance d which is longer than the focal distance p1. The parabola S11 is provided on the X-axis and parabola S12 is disposed on the Y-axis. The light emitting diode 1 is located between the focus P1 of the parabola S11 and the origin PO of the parabola S11. Therefore, light beams discharge in the same directions as previous embodiments as shown in FIGS. 15, 16.

Figure 17:
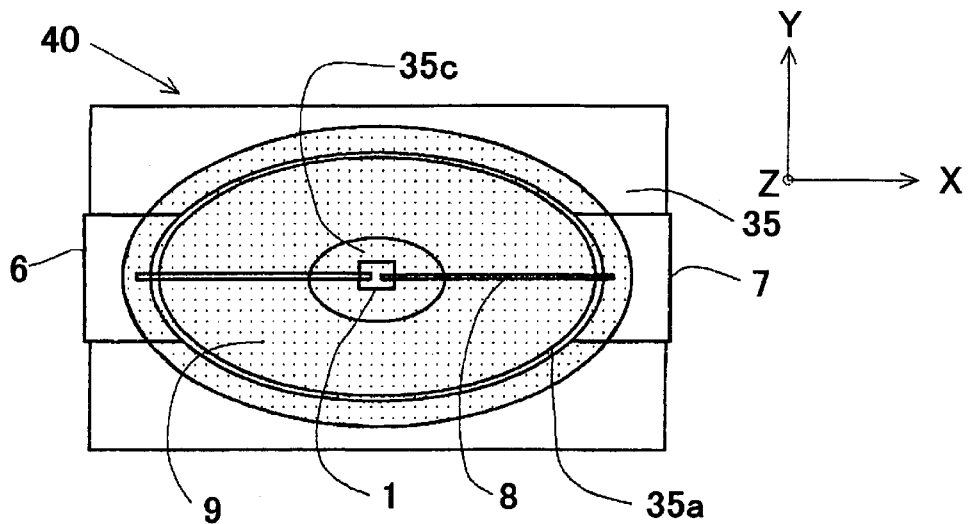
FIG. 17 is a plan view of the fourth embodiment.
Figure 18:
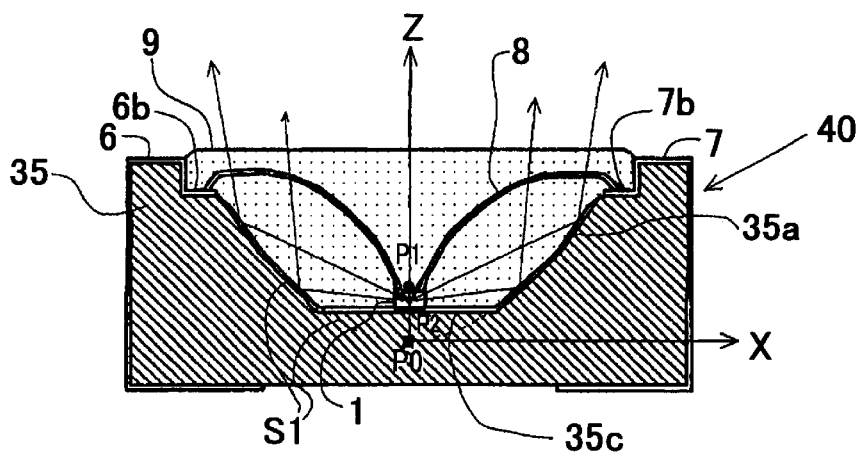
FIG. 18 is a sectional view taken along the X-line.
Figure 19:
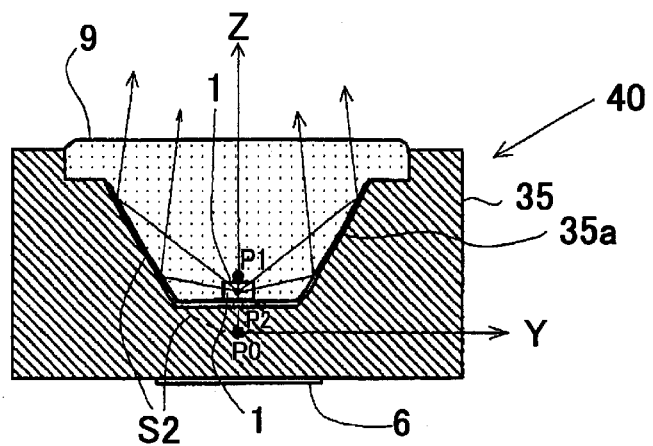
FIG. 19 is a sectional view taken along the Y-line.

FIG. 17 is a plan view of the fourth embodiment, FIG. 18 is a sectional view taken along the X-line, and FIG. 19 is a sectional view taken along the Y-line.

In a light emitting diode device 40, there is not provided the substrate 2 in FIG. 4 of the first embodiment. A reflector member 35 is downwardly extended and a reflector surface 35a has a flat bottom 35c. The light emitting diode is mounted on the bottom 35c. Other parts are the same as the first embodiment.

Figure 20:
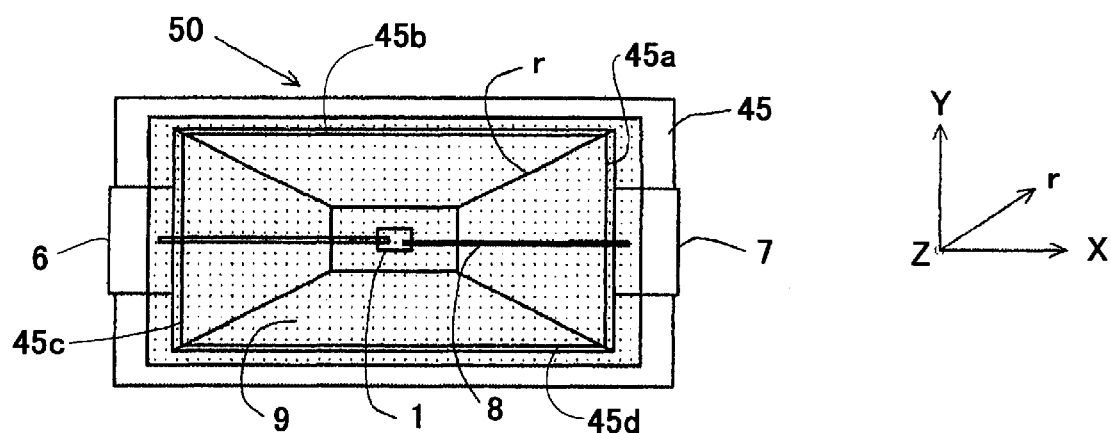
FIG. 20 is a plan view of the fifth embodiment.
Figure 21:
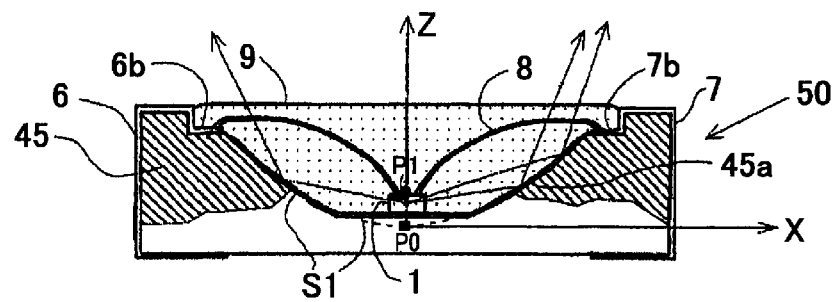
FIG. 21 is a sectional view taken along the X-line.
Figure 22:
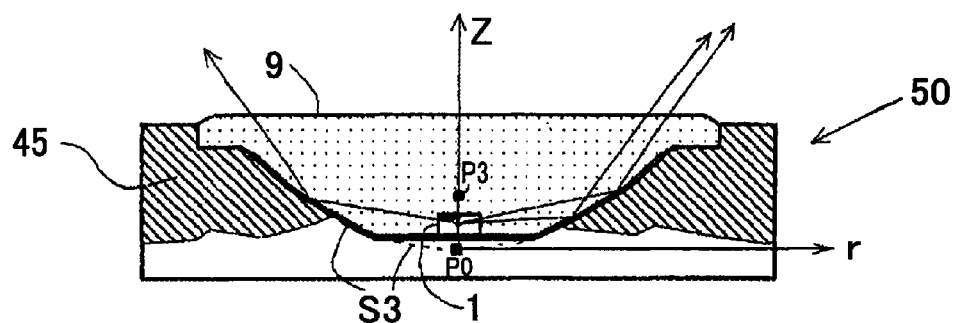
FIG. 22 is a sectional view taken along a ridge line r.
Figure 23:
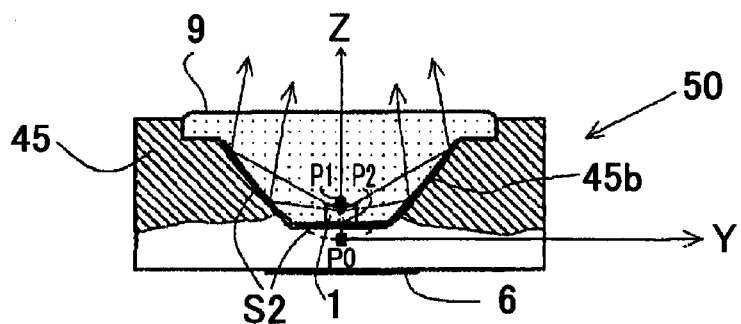
FIG. 23 is a sectional view taken along the Y-line.

FIG. 20 is a plan view of the fifth embodiment. FIG. 21 is a sectional view taken along the X-line, FIG. 22 is a sectional view taken along a ridge line r, and FIG. 23 is a sectional view taken along the Y-line.

A light emitting diode device 50 has a reflector member 45 having a construction similar to the reflector member 35 of the fourth embodiment. The reflector member 45 has a rectangular shape elongated in the X-axis in plan view, and comprises four reflector surfaces 45a, 45b, 45c and 45d. The reflector surfaces 45a and 45c are formed by the parabola S1, and reflector surfaces 45b and 45d are formed by the parabola S2. Between adjacent reflector surfaces the ridge line r is forms. Opposite ridge lines r formed a parabola s3.

Figure 9:
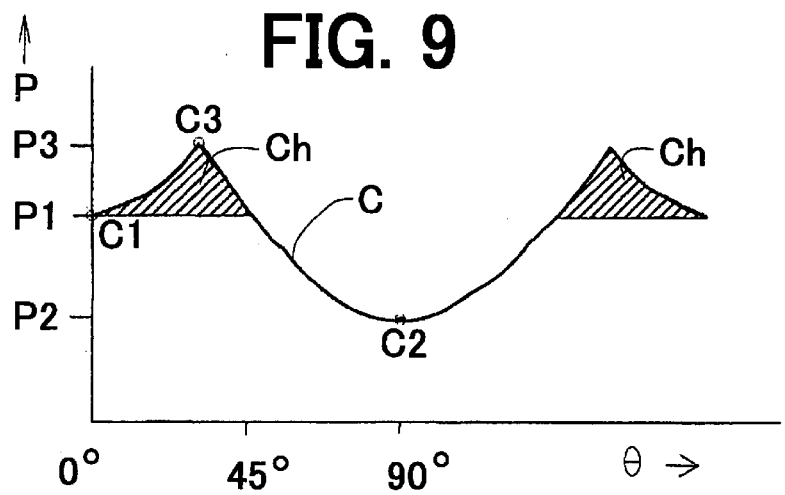

FIG. 9 shows the position of the focuses P of the parabolas S1, S2 and S3. When the angle θ of the line a (FIG. 7) is zero (θ=0°), the focus position is P1 at a position C1 on a line C. As the angle θ increases, the position P becomes high. At a position C3 (θ=about 30°), the position P is a maximum P3 of the parabola S3. The parabola S3 is gentle compared with the slope of the parabola S1 as shown in FIG. 22.

When the angle θ further increases, the position P becomes low. At a point C2, the position P becomes lowermost of the parabola S2 at focus P2.

Figure 24:
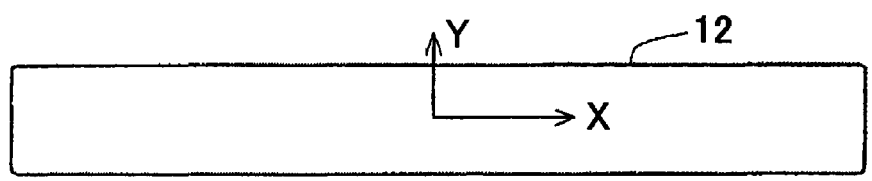
FIG. 24 is a sectional view of a bundle of rays.

In the present embodiment, there is provided a region Ch (FIG. 9) where the focal distance p becomes larger (P3) than the focal distance p1. Therefore, light beams are further expanded from the Z-axis as shown in FIG. 22. Thus, the sectional shape of the bundle of rays expands to a rectangular shape elongated in the X-line as shown in FIG. 24. Consequently, a large rectangular area is uniformly illuminated.

Figure 25:
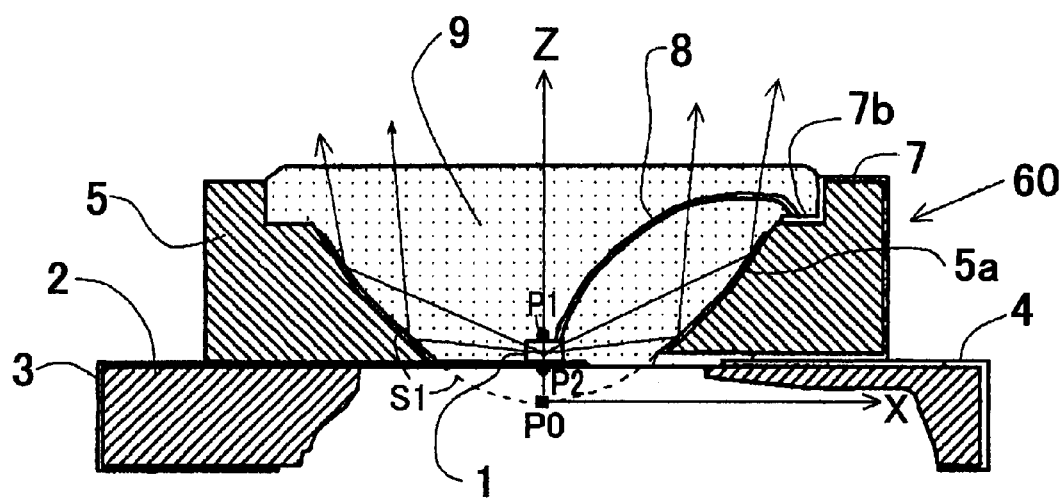
FIG. 25 is a sectional view of a light emitting diode device of the sixth embodiment of the present invention.
Figure 26:
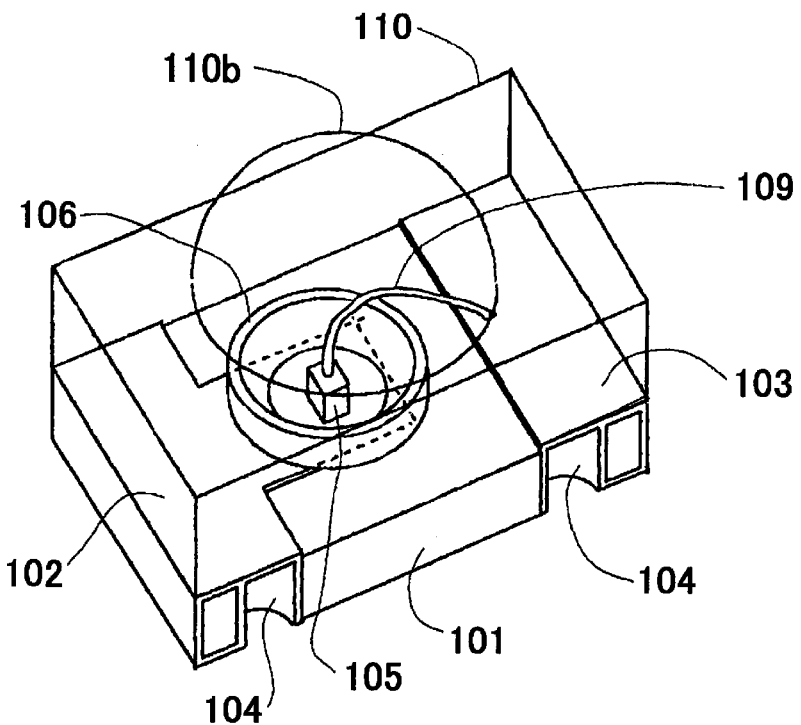
FIG. 26 is a perspective view showing a conventional light emitting diode device.
Figure 27:
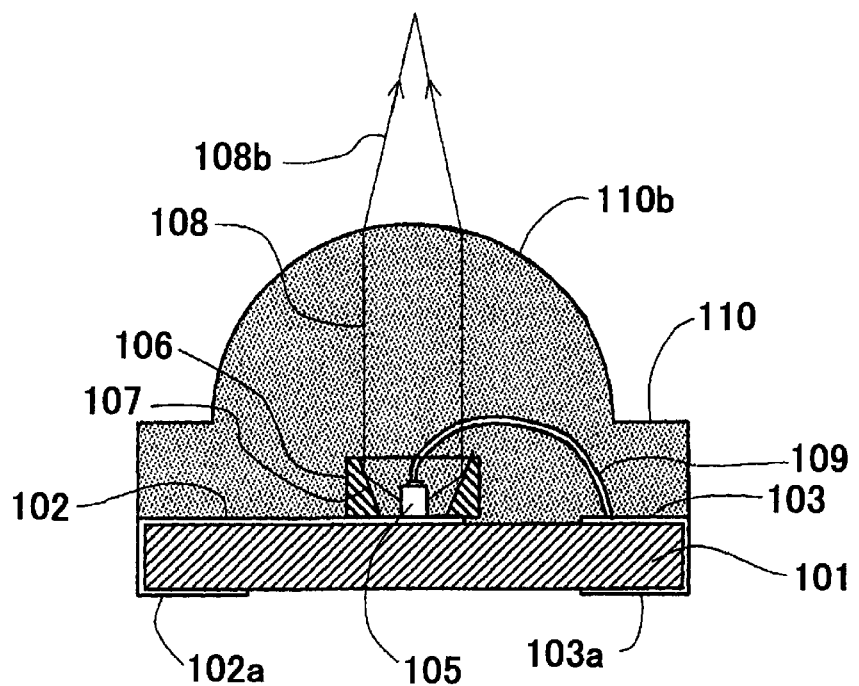
FIG. 27 is a sectional view of the light emitting diode device.
Figure 28:
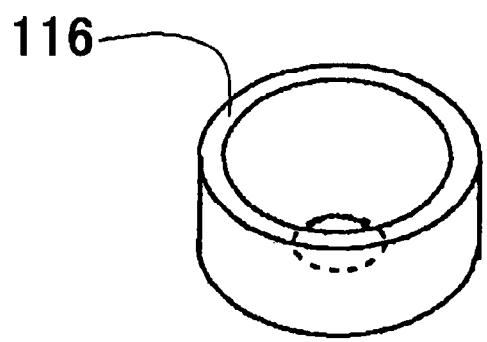
FIG. 28 is a perspective view showing another reflector.
Figure 29:
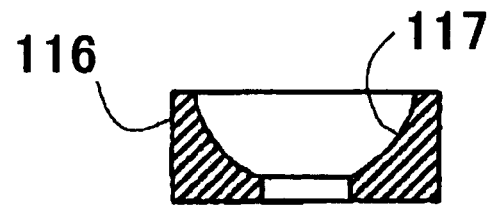
FIG. 29 is a sectional view of the reflector.

FIG. 25 is a sectional view of a light emitting diode device of the sixth embodiment of the present invention.

In the light emitting diode device 60, the bonding wire 8 for the cathode and the cathode leading pattern 6 in the first embodiment are omitted. The cathode of the light emitting diode 1 is directly connected to the cathode electrode pattern 3 by die bonding. Other construction is the same as the first embodiment.

While the invention has been described in conjunction with preferred specific embodiment thereof, it will be understood that this description is intended to illustrate and not limit the scope of the invention, which is defined by the following claims.

What is claimed is:

1. A light emitting diode device comprising:

a reflector member having a recess with an opening which comprises a first part extending in an X-axis direction, and a second part extending in a Y-axis direction, the first part having greater length than the second part;

a reflector surface provided on an inner surface of the recess;

the reflector surface comprising a first reflector surface about the X-axis and a second reflector surface about the Y-axis;

the first reflector surface having a first parabola having a first focus, and the second reflector surface having a second parabola having a second focus;

a light emitting diode provided in the recess; and the light emitting diode being located at a position with respect to the first and second foci so that light reflected by the first reflector surface recedes from an optical axis, and light reflected by the second reflector surface approaches to the optical axis.

2. The device according to claim 1 further comprising a substrate, and the reflector member being mounted on the substrate.

3. The device according to claim 1 wherein the light emitting diode is located at a position between the first focus of the first parabola and the second focus of the second parabola.

4. The device according to claim 3 wherein a focal distance of the parabola about the X-axis is longer than a focal distance of the parabola about the Y-axis.

* * * * *

UNITED STATES PATENT AND TRADEMARK OFFICE
CERTIFICATE OF CORRECTION

PATENT NO. : 6,700,137 B2
DATED : March 2, 2004
INVENTOR(S) : Megumi Horiuchi et al.

It is certified that error appears in the above-identified patent and that said Letters Patent is hereby corrected as shown below:

<u>Title page</u>,
Item [73], Assignee, after "Citizen Electronics Company, Ltd., Yamanashi-ken (JP)" add -- Kawaguchiko Seimitsu Co. Ltd., Yamanashi-ken (JP) --

Signed and Sealed this

Fifth Day of October, 2004

JON W. DUDAS
*Director of the United States Patent and Trademark Office*